(12) United States Patent
Lee et al.

(10) Patent No.: US 7,598,105 B2
(45) Date of Patent: Oct. 6, 2009

(54) LIGHT EMITTING DIODE STRUCTURE AND METHOD FOR FABRICATING THE SAME

(75) Inventors: Chia-Ming Lee, Yilan County (TW); Hung-Cheng Lin, Taipei County (TW); Jen-Inn Chyi, Taoyuan County (TW)

(73) Assignee: Tekcore Co., Ltd., Nantou (TW)

( * ) Notice: Subject to any disclaimer, the term of this patent is extended or adjusted under 35 U.S.C. 154(b) by 53 days.

(21) Appl. No.: 11/963,517

(22) Filed: Dec. 21, 2007

(65) Prior Publication Data

US 2009/0159871 A1    Jun. 25, 2009

(51) Int. Cl.
  *H01L 21/00*    (2006.01)
(52) U.S. Cl. ................................. 438/44; 257/E33.006
(58) Field of Classification Search .................... 438/44
  See application file for complete search history.

(56) References Cited

U.S. PATENT DOCUMENTS 6,870,193 B2    3/2005    Takeya et al.
2005/0196888 A1*  9/2005   Morita ........................ 438/44
2008/0230793 A1*  9/2008   Yoon et al. .................... 257/94

* cited by examiner

*Primary Examiner*—Thao X Le
*Assistant Examiner*—Kimberly Trice
(74) *Attorney, Agent, or Firm*—Muncy, Geissler, Olds & Lowe, PLLC

(57) ABSTRACT

The present invention discloses a light emitting diode structure and a method for fabricating the same. In the present invention, a substrate is placed in a solution to form a chemical reaction layer. Next, the substrate is etched to form a plurality of concave zones and a plurality of convex zones with the chemical reaction layer overhead. Next, the chemical reaction layer is removed to form an irregular geometry of the concave zones and convex zones on the surface of the substrate. Then, a semiconductor light emitting structure is epitaxially formed on the surface of the substrate. Thereby, the present invention can achieve a light emitting diode structure having improved internal and external quantum efficiencies.

23 Claims, 9 Drawing Sheets

LIGHT EMITTING DIODE STRUCTURE AND METHOD FOR FABRICATING THE SAME

FIELD OF THE INVENTION

The present invention relates to a light emitting diode structure, particularly to a light emitting diode structure and a method for fabricating the same, wherein a natural etching mask is used in a selective etching to form on the surface of the substrate an irregular geometry of concave zones and convex zones, which can change the light propagation direction inside the semiconductor layer and increase the external quantum efficiency of the light emitting diode.

BACKGROUND OF THE INVENTION

Improving LED (Light Emitting Diode) light efficiency is a top priority for realizing a solid-state illuminator. There are two approaches to improve LED light efficiency: one is to increase LED internal quantum efficiency, and the other is to increase LED external quantum efficiency (LED light extraction efficiency).

Improving the quality of epitaxial material can most directly and obviously promote internal quantum efficiency. An ELOG (Epitaxial Lateral Over-Growth) technology is used to improve the quality of epitaxial material, wherein gallium nitride layer is laterally overgrown on the substrate having patterned silicon-dioxide strips, and whereby threading dislocations are reduced, and internal quantum efficiency is increased.

An LEPS (Lateral Epitaxial Pattern Substrate) technology, which was disclosed in U.S. Pat. No. 6,870,193, has the same effect as ELOG. The LEPS technology uses a dry- or wet-etching method to form patterns on the substrate, which not only has a simple fabrication process but also can reduce the time for epitaxial growth. This technology can also effectively reduce threading dislocations and increase LED light efficiency.

There is a great difference between the refractive indexes of a semiconductor and a packaging material; therefore, an LED usually has a small total reflection critical angle. The light generated by LED reaching an interface by an angle greater than the total reflection critical angle will be totally reflected back to the interior of the LED chip. Then, the probability that light leaves a semiconductor from an interface decreases, and photons can only be totally reflected inside a chip until they are completely absorbed and converted into heat. Thus, LED has an insufficient light efficiency.

Changing the geometry of LED is an effective measure to improve LED light efficiency. A U.S. Pat. No. 6,870,193 disclosed a semiconductor light emitting element, which has a concave and/or convex structure formed on the substrate. Compared with a planar substrate, such a structure can scatter or diffract the horizontally-propagating light with the concave or convex structure and thus can greatly promote external quantum efficiency. Further, applying ELOG to the concave or convex structure of the substrate can reduce the threading dislocations of the gallium nitride layer and promote the internal quantum efficiency of LED.

In the abovementioned conventional technology, the fabrication process of the concave or convex structure includes: forming a passivation layer on a substrate; patterning the geometry of the concave or convex structure on the passivation layer with a photolithographic process; and etching the substrate to form the concave or convex structure with a dry- or wet-etching method. However, such a process is more complicated and cost-inefficient, which will impair the commercialization of LED.

SUMMARY OF THE INVENTION

The present invention provides a light emitting diode structure and a method for fabricating the same, wherein a chemical reaction layer is formed on the surface of the substrate to function as a natural etching mask of the substrate; the substrate is then etched to form an irregular geometry of serrations with a dry- or wet-etching method on the surface thereof to promote the internal and external quantum efficiencies of the light emitting diode.

The method for fabricating a light emitting diode comprises: providing a substrate, wherein the substrate is made of sapphire ($Al_2O_3$), silicon carbide (SiC), silicon (Si), gallium arsenide (GaAs), aluminum nitride (AlN), or gallium nitride (GaN); placing the substrate in a first solution to form a chemical reaction layer on the surface of the substrate; selectively etching the substrate with the chemical reaction layer being a mask and via a dry- or wet-etching method or a combination of both etching methods to form a plurality of concave zones on the substrate where no chemical reaction layer exists and form a plurality of convex zones with the chemical reaction layer overhead; placing the substrate in a second solution to remove the chemical reaction layer and form an irregular geometry of the concave zones and convex zones on the surface of the substrate, wherein the height difference between the concave zones and the convex zones is from 0.1 to 15 μm; thoroughly cleaning the surface of the substrate, forming a semiconductor light emitting structure, and using an ELOG (Epitaxial Lateral Over-Growth) technology to make the semiconductor light emitting structure fill up the concave zones with no pore formed.

Either of the first solution and the second solution is a solution selected from a group consisting of acidic solutions, or a group consisting of basic solutions. Alternatively, either of the first solution and the second solution is a mixed solution selected from a group consisting of acidic solutions or a group consisting of basic solutions. The acidic solution group includes: hydrofluoric acid (HF), sulfuric acid ($H_2SO_4$), hydrochloric acid (HCl), phosphoric acid ($H_3PO_4$), nitric acid ($HNO_3$), aqua regia, buffered oxide etch (BOE), Al Etchant, hydrogen peroxide ($H_2O_2$), formic acid (HCOOH), acetic acid ($CH_3COOH$), succinic acid ($C_4H_6O_4$), and citric acid. The basic solution group includes: potassium hydroxide (KOH), sodium hydroxide (NaOH), calcium hydroxide (Ca$(OH)_2$), ammonium hydroxide ($NH_4OH$), and tetramethylammonium hydroxide (TMAH). The substrate should be respectively placed in the first solution and he second solution for from 1 second to 200 minutes.

The semiconductor light emitting structure is formed via epitaxially forming at least one n-type semiconductor layer, an active layer, and at least one p-type semiconductor layer sequentially, wherein the active layer functions as a light emitting layer and is interposed between the n-type semiconductor layer and the p-type semiconductor layer. The p-type semiconductor layer is electrically coupled to a p-type ohmic contact electrode, and the n-type semiconductor layer is electrically coupled to an n-type ohmic contact electrode, to provide a forward bias for the semiconductor light emitting structure.

Alternatively, a pre-treatment may be first performed before the substrate is placed in the first solution. The pre-treatment is to grow a passivation layer having a thickness of between 1 Å and 10 μm on the surface of the substrate. The passivation layer may be a single- or multi-layer structure made of one or more materials selected from the group including: silicon, silicon nitride, silicon oxide, aluminum oxide, metal, photoresist, benzocyclobutene, and polyimide.

The passivation layer is patterned with a photolithographic process to form periodical patterns to expose parts of the surface of the substrate before the substrate is placed in the first solution. The periodical pattern of the passivation layer may be the periodical pattern of circles, polygons, or the combination of them. The width of the periodical pattern is within from 0.1 to 15 μm, and the spacing between the periodical patterns is also within from 0.1 to 15 μm.

After the passivation layer has been patterned with a photolithographic process to form periodical patterns, the exposed surfaces of the substrate are etched to form a plurality of concave zones. Next, the passivation layer is removed. Then, the substrate is placed in the first solution to make the serrations on the substrate more distinct.

Alternatively, the pre-treatment is to grow an epitaxial layer having a thickness of between 1 Å and 10 μm on the surface of the substrate. The epitaxial layer is made of one or more materials selected from the group including: gallium nitride, indium nitride and aluminum nitride.

The epitaxial layer is patterned with a photolithographic process to form periodical patterns to expose parts of the surface of the substrate before the substrate is placed in the first solution. The periodical pattern of the passivation layer may be the periodical pattern of circles, polygons, or the combination of them. The width of the periodical pattern is within from 0.1 to 15 μm, and the spacing between the periodical patterns is also within from 0.1 to 15 μm.

The light emitting diode structure fabricated according to the abovementioned method comprises: a substrate having an irregular geometry of concave zones and convex zones, which are formed via etching; and a semiconductor light emitting structure formed on the surface of the substrate and formed via epitaxially forming at least one n-type semiconductor layer, an active layer, and at least one p-type semiconductor layer sequentially, wherein the active layer functions as a light emitting layer and is interposed between the n-type semiconductor layer and the p-type semiconductor layer, and wherein the p-type semiconductor layer is electrically coupled to a p-type ohmic contact electrode, and the n-type semiconductor layer is electrically coupled to an n-type ohmic contact electrode, to provide a forward bias for the semiconductor light emitting structure, wherein the n-type semiconductor layer fills up the concave zones and the convex zones with no pore formed.

The height difference between the concave zones and the convex zones is from 0.1 to 15 μm. The active layer is a double heterogeneous junction structure, a single quantum well structure or a double quantum well structure.

The advantage of the present invention is to use a novel process to form a chemical reaction layer on the surface of the substrate, and use the chemical reaction layer as a natural etching mask to form an irregular geometry of serrations on the surface of the substrate via a dry- or wet-etching method. The light generated by the LED element will be scattered or diffracted by the irregular serrations. Thus, the horizontal light propagation between the substrate and the semiconductor layers is decreased, and the total reflection is reduced, and the light extraction efficiency of the LED element is increased. Besides, growing epitaxial materials on the serrated surface of the substrate can reduce threading dislocations, promote the quality of the epitaxial material, and increase the internal quantum efficiency. Further, the present invention has a simple process and thus can reduce fabrication cost and benefit mass-production.

DETAILED DESCRIPTION OF THE PREFERRED EMBODIMENTS

The technical contents of the present invention will be described in detail with the embodiments. However, it should be noted that the embodiments are only to exemplify the present invention but not to limit the scope of the present invention.

Embodiment I

Figure 1:
FIG. 1 to FIG. 5 are diagrams schematically showing a first embodiment of the present invention.

Refer to from FIG. 1 to FIG. 5 diagrams schematically showing a first embodiment of the present invention. The method of the present invention includes providing a substrate 100, as shown in FIG. 1. The substrate 100 may be made of sapphire, silicon carbide, silicon, gallium arsenide, aluminum nitride, or gallium nitride.

Figure 2:
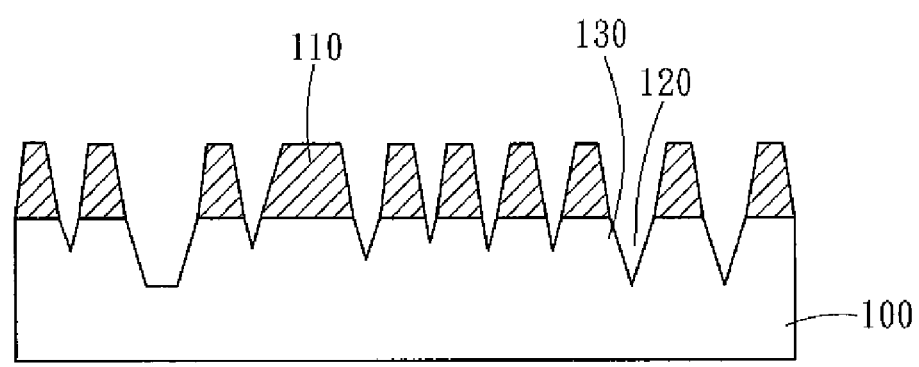

Next, the substrate 100 is placed in a first solution for chemical reaction, and a high-density nanometric chemical reaction layer 110 naturally forms on the surface of the substrate 100. The substrate 100 should be placed in the first solution for from 1 second to 200 minutes. Next, the substrate 100 is selectively etched to form a plurality of concave zones 120 on the substrate 100 without the chemical reaction layer 110 and form a plurality of convex zones 130 having the chemical reaction layer 110 overhead with the chemical reaction layer 110 being a mask and with a dry-etching method, a wet-etching method, or a combination of a dry-etching method and a wet-etching method, as shown in FIG. 2.

Thereinafter, a sapphire ($Al_2O_3$) substrate will be used to exemplify the substrate 100. A sapphire ($Al_2O_3$) substrate is placed in a 96% sulfuric acid ($H_2SO_4$) solution (the first solution) at a temperature of between 25° C. and 400° C. for from 1 second to 200 minutes. A high-density nanometric chemical reaction layer 110 ($Al_2(SO_4)_3$, $Al_2(SO_4).17H_2O$, etc.) is thus formed on the substrate 100. Then, with the chemical reaction layer 110 being a mask, the substrate 100 is selectively etched with a dry-etching method or a wet-etching method.

Thus, concave zones 120 and convex zones 130 are formed on the sapphire ($Al_2O_3$) substrate. When the sapphire substrates are respectively placed in the first solution (such as sulfuric acid) for from 2.5 to 20 minutes, the substrates 100 respectively having different average etching depths, different average grain sizes, different densities, and different RMS roughnesses will be formed. The results observed with an atomic force microscope are shown in the table below.

| Etching Time (min) | Average Etching Depth (μm) | Average Grain Size (μm) | Density (1/μm$^2$) | RMS Roughness (nm) |
|---|---|---|---|---|
| 2.5 | 0.360 | 5.36 | 0.0092 | 106.24 |
| 5.0 | 0.683 | 6.04 | 0.0096 | 207.30 |
| 10.0 | 1.759 | 12.30 | 0.0108 | 471.15 |
| 20.0 | 2.351 | 15.03 | 0.0080 | 700.77 |

Figure 3:
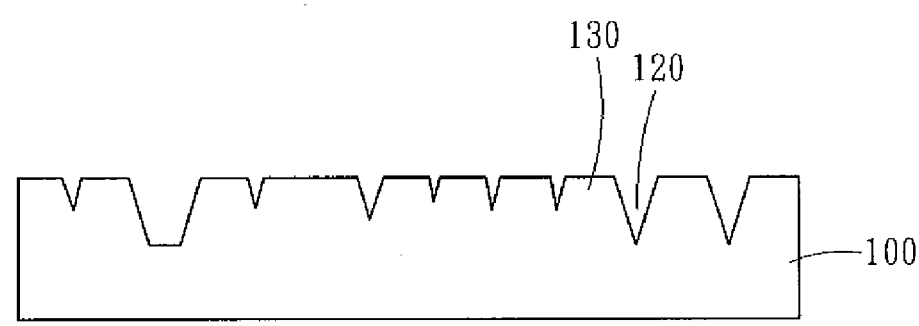

Next, the substrate 100 is placed in a second solution to remove the chemical reaction layer 110 and form an irregular geometry of the concave zones 120 and convex zones 130 on the substrate 100, as shown in FIG. 3. When the second solution is exemplified by phosphoric acid ($H_3PO_4$), the chemical reaction layer 110 can be thoroughly removed, and the surface of the substrate 100 can be cleaned, via placing the substrate 100 in phosphoric acid at a temperature of between 25° C. and 400° C. for from 0.1 to 200 minutes.

Figure 4:
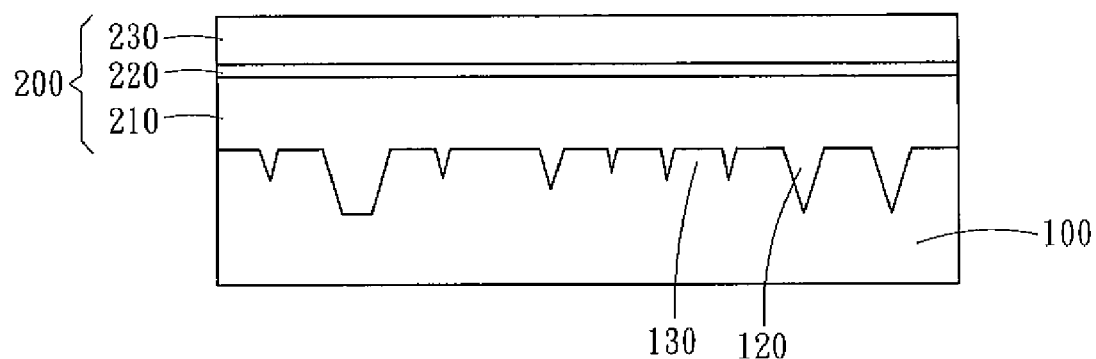
Figure 5:
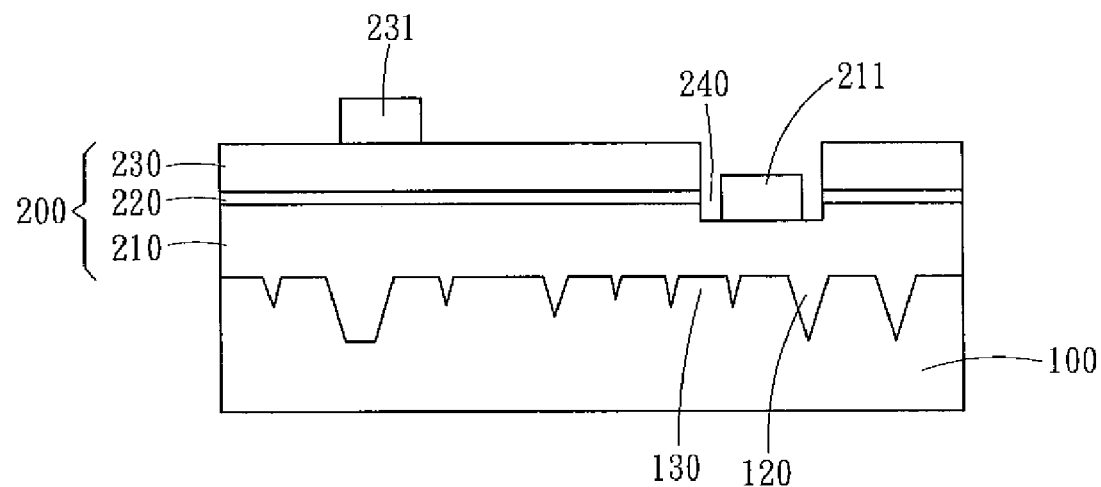

Next, a semiconductor light emitting structure 200 is formed on the surface of the substrate 100. The semiconductor light emitting structure 200 is formed via epitaxially forming at least one n-type semiconductor layer 210, an active layer 220, and at least one p-type semiconductor layer 230 sequentially, wherein the active layer 220 functions as a light emitting layer and is interposed between the n-type semiconductor layer 210 and the p-type semiconductor layer 230, as shown in FIG. 4. The p-type semiconductor layer 230 is electrically coupled to a p-type ohmic contact electrode 231, and the n-type semiconductor layer 210 is electrically coupled to an n-type ohmic contact electrode 211 via a contact window 240, to provide a forward bias for the semiconductor light emitting structure 200, as shown in FIG. 5.

The LED structure fabricated according to the abovementioned method comprises: a substrate 100, wherein irregular concave zones 120 and convex zones 130 are formed on the surface of the substrate 100; a semiconductor light emitting structure 200 epitaxially grown on the surface of the substrate 100, wherein the semiconductor light emitting structure 200 is formed via epitaxially forming at least one n-type semiconductor layer 210, an active layer 220, and at least one p-type semiconductor layer 230 sequentially, and wherein the active layer 220 functions as a light emitting layer and is interposed between the n-type semiconductor layer 210 and the p-type semiconductor layer 230, and wherein the p-type semiconductor layer 230 is electrically coupled to a p-type ohmic contact electrode 231, and the n-type semiconductor layer 210 is electrically coupled to an n-type ohmic contact electrode 211 via a contact window 240, to provide a forward bias for the semiconductor light emitting structure 200. Further, the n-type semiconductor layer 210 fills up the abovementioned concave zones 120 and convex zones 130 so that the n-type semiconductor layer 210 is free of pores. The height difference between the concave zones 120 and convex zones 130 is from 0.1 to 15 μm. The active layer 220 is a double heterogeneous junction structure, a single quantum well structure or a double quantum well structure.

The present invention utilizes the ELOG technology to adjust the pressure and temperature for epitaxial growth and make the lateral growth faster than the longitudinal growth. Thereby, the n-type semiconductor layer 210, which has a greater thickness among the semiconductor light emitting structure 200, can fill up the abovementioned concave zones 120 and convex zones 130. Thus, the n-type semiconductor layer 210 is free of pores around the concave zones 120 and convex zones 130, and a high-quality epitaxial material with less threading dislocations is achieved. When the n-type semiconductor layer 210 is realized with an about 3.5 μm thick gallium nitride and the surface thereof is examined with an EPD (Etching Pits Density) method, a PL (Photo-Luminescence) method, and an XRD (X-Ray Diffraction) method, the test results are shown in the following table.

| | Sample | | | | | | | | |
|---|---|---|---|---|---|---|---|---|---|
| | GaN on Sapphire | | | | | | Sapphire substrate | | |
| | Etch pit density | | | | PL | | Average | | |
| Etch time (min.) | (cm$^{-2}$) | | XRD-FWHM (arcsec) | | PL intensity (a.u.) | PL FWHM (meV) | Etch deep (um) | Grain size (um) | RMS rough. (nm) |
| | Screw & Mix type | Edge type | (002) | (105) | $I_{BE}/I_{YL}$ | | | | |
| 0 | 3.62 × 10$^8$ | 2.58 × 10$^8$ | 201.0 | 272.9 | 2.07 | 68 | | | |
| 2.5 | 2.66 × 10$^8$ | 1.72 × 10$^8$ | 181.3 | 238.8 | 6.07 | 62 | 0.36 | 5.03 | 106.24 |
| 5 | 1.94 × 10$^8$ | 9.4 × 10$^7$ | 177.7 | 196.5 | 9.05 | 58 | 0.68 | 6.04 | 207.30 |

As the influence of the concave zones 120 and convex zones 130 on the active layer 220 is reduced, the active layer 220 has a superior crystallinity and less threading dislocations. Then, the internal quantum efficiency is increased. The concave zones 120 and convex zones 130 will scatter or diffract the light emitted from the active layer 220 and reduce the horizontal propagation and total reflection of light. The light projecting upward or downward is increased. Then, the light extraction efficiency is increased, and the total light efficiency is promoted.

Embodiment II

Figure 6:
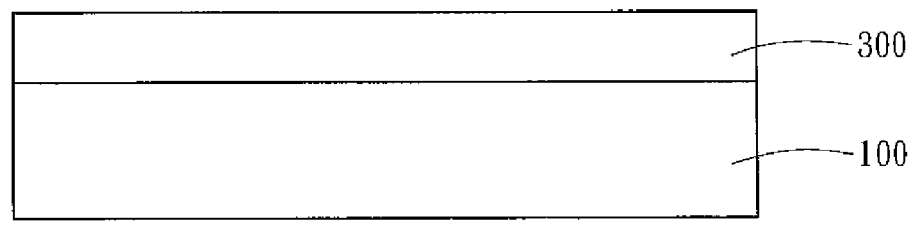
FIG. 6 to FIG. 8 are diagrams schematically showing a second embodiment of the present invention.
Figure 7:
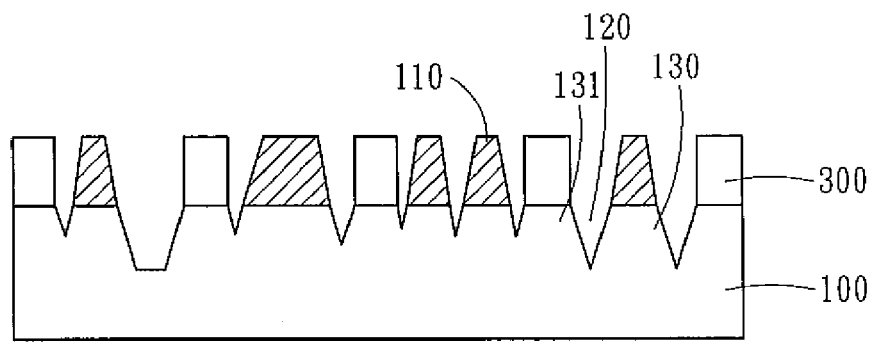
Figure 8:
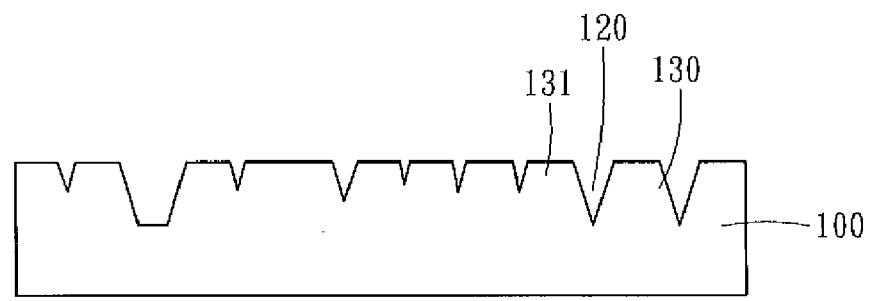

Refer to from FIG. 6 to FIG. 8 diagrams schematically showing a second embodiment of the present invention. The method of the second embodiment is based on that of the first embodiment, but a pre-treatment is first performed before the substrate 100 is placed in the first solution. The pre-treatment is to grow a passivation layer 300 having a thickness of between 1 Å and 10 μm on the surface of the substrate 100, as shown in FIG. 6. The passivation layer 300 may be a single- or multi-layer structure made of one or more materials selected from the group including: silicon, silicon nitride, silicon oxide, aluminum oxide, metal, photoresist, benzocyclobutene, and polyimide.

Then, the substrate 100 is placed in the first solution to form a high-density nanometric chemical reaction layer 110 inside the passivation layer 300 on the surface of the substrate 100. Next, the substrate 100 is selectively etched with the passivation layer 300 and the chemical reaction layer 110 being a mask to form a plurality of concave zones 120 on the substrate 100 where no passivation layer 300 or chemical reaction layer 110 exists and form a plurality of convex zones 130 and 131 with the chemical reaction layer 110 or the passivation layer 300 overhead, as shown in FIG. 7.

Next, the substrate 100 is placed in the second solution to remove the chemical reaction layer 110 and form an irregular geometry of the concave zones 120 and convex zones 130 on the substrate 100. Next, the passivation layer 300 is also removed to reveal the convex zones 131, and the surface of the substrate 100 is also thoroughly cleaned, as shown in FIG. 8. Then, similarly to the first embodiment, the semiconductor light emitting structure 200 is formed on the surface of the substrate 100, as shown in FIG. 4 and FIG. 5.

Embodiment III

Figure 9:
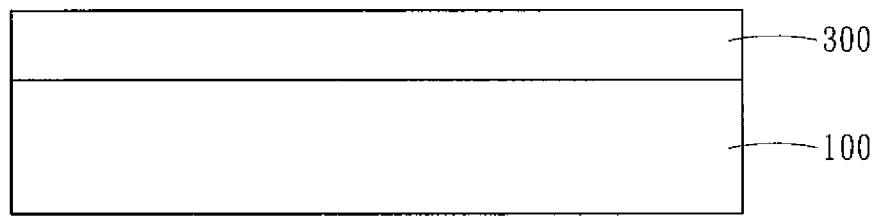
FIG. 9 to FIG. 13 are diagrams schematically showing a third embodiment of the present invention.
Figure 10:
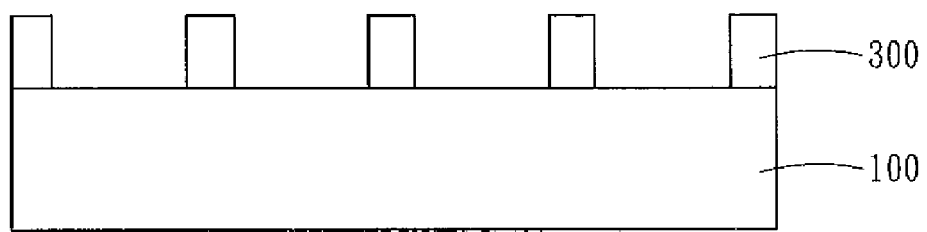

Refer to from FIG. 9 to FIG. 13 diagrams schematically showing a third embodiment of the present invention. The method of the third embodiment is based on that of the second embodiment, and the pretreatment is also to grow a passivation layer 300 on the surface of the substrate 100, as shown in FIG. 9. Next, the passivation layer 300 is patterned with a photolithographic process to form periodical patterns to expose parts of the surface of the substrate 100, as shown in FIG. 10. The periodical patterns of the passivation layer 300 may be the periodical pattern of circles, polygons, or the combination of them. The width of the periodical pattern is within from 0.1 to 15 μm, and the spacing between the periodical patterns is also within from 0.1 to 15 μm.

Figure 11:
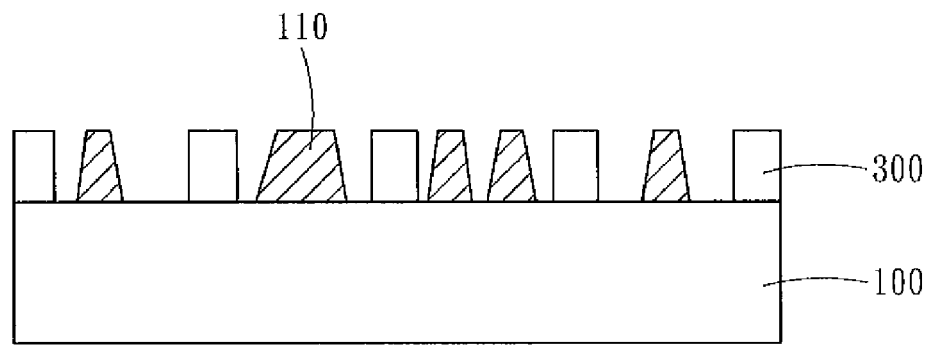
Figure 12:
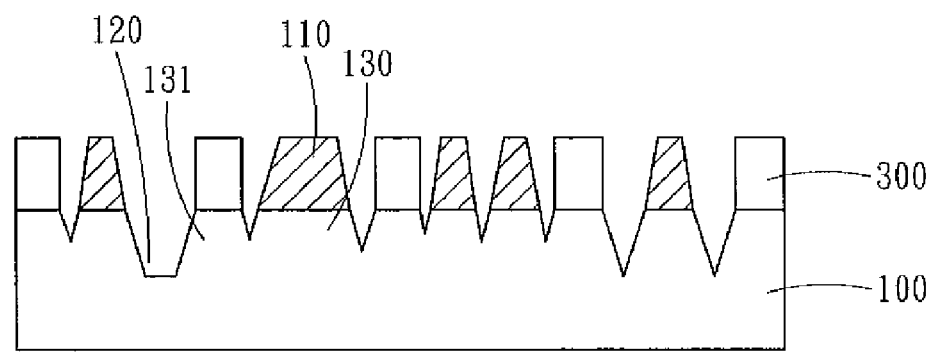

Next, the substrate 100 is placed in the first solution to form a high-density nanometric chemical reaction layer 110 on the exposed surfaces of the substrate 100, as shown in FIG. 11. Next, the substrate 100 is selectively etched with the passivation layer 300 and the chemical reaction layer 110 being a mask to form a plurality of concave zones 120 on the substrate 100 where no passivation layer 300 or chemical reaction layer 10 exists and form a plurality of convex zones 130 and 131 with the chemical reaction layer 110 or the passivation layer 300 overhead, as shown in FIG. 12.

Figure 13:
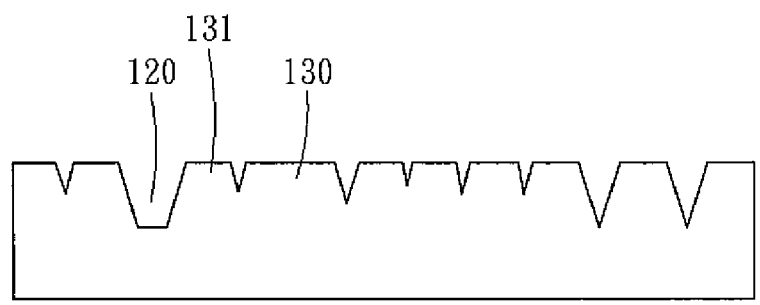

Next, the substrate 100 is placed in the second solution to remove the chemical reaction layer 110 and form an irregular geometry of the concave zones 120 and convex zones 130 on the substrate 100. Next, the passivation layer 300 is also removed to reveal the convex zones 131, and the surface of the substrate 100 is also thoroughly cleaned, as shown in FIG. 13. Then, similarly to the first embodiment, the semiconductor light emitting structure 200 is formed on the surface of the substrate 100, as shown in FIG. 4 and FIG. 5.

Embodiment IV

Figure 14:
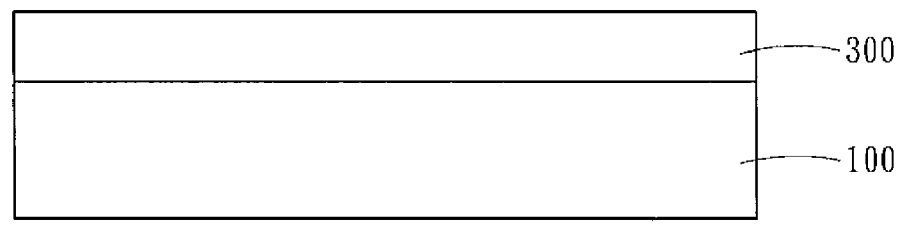
FIG. 14 to FIG. 18 are diagrams schematically showing a fourth embodiment of the present invention.
Figure 15:
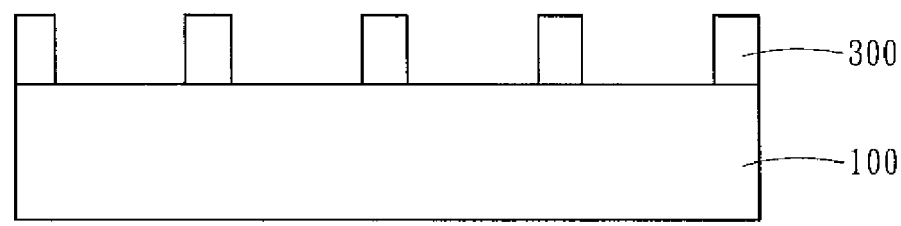
Figure 16:
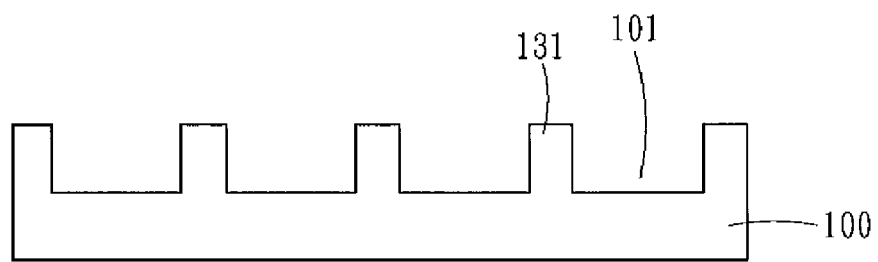

Refer to from FIG. 14 to FIG. 18 diagrams schematically showing a fourth embodiment of the present invention. The method of the fourth embodiment is based on that of the third embodiment, and the pretreatment is also to grow a passivation layer 300 on the surface of the substrate 100, as shown in FIG. 14. Next, the passivation layer 300 is patterned with a photolithographic process to form periodical patterns to expose parts of the surface of the substrate 100, as shown in FIG. 15. Next, the exposed surfaces of the substrate 100 are etched to form a plurality of recesses 101, and then the passivation layer 300 is removed to reveal the convex zones 131, as shown in FIG. 16.

Figure 17:
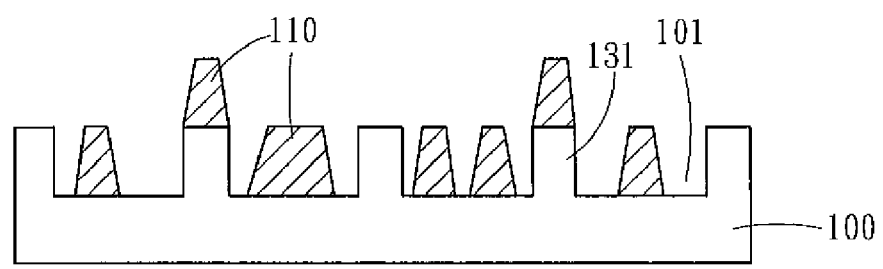

Next, the substrate 100 is placed in the first solution to form a high-density nanometric chemical reaction layer 110 on the convex zones 131 and recesses 101 of the substrate 100, as shown in FIG. 17.

Figure 18:
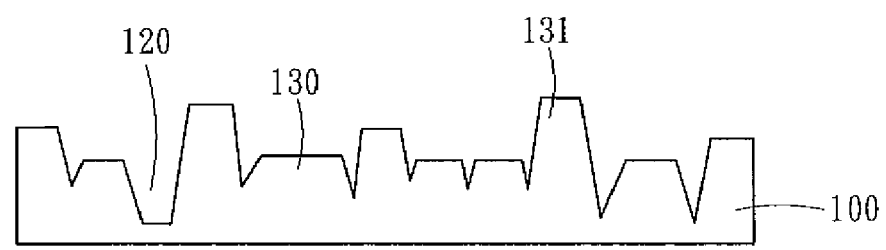

Next, the substrate 100 is selectively etched with the chemical reaction layer 110 being a mask to form a plurality of concave zones 120 on the substrate 100 where no passivation layer 300 or chemical reaction layer 110 exists and form a plurality of convex zones 130 and 131 with the chemical reaction layer 110 or the passivation layer 300 overhead. Thus, a rugged surface having obvious height drops is formed. Next, the substrate 100 is placed in the second solution to remove the chemical reaction layer 110 and form on the surface of the substrate 100 an irregular geometry of the concave zones 120 and convex zones 130 and 131, as shown in FIG. 18.

Similarly to the first embodiment, the semiconductor light emitting structure 200 is formed on the surface of the substrate 100, as shown in FIG. 4 and FIG. 5.

Embodiment V

Figure 19:
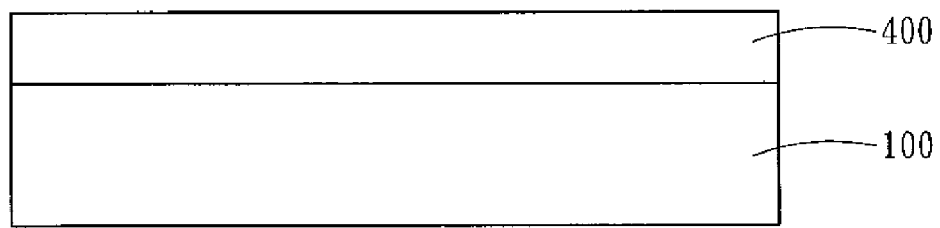
FIG. 19 to FIG. 21 are diagrams schematically showing a fifth embodiment of the present invention.
Figure 20:
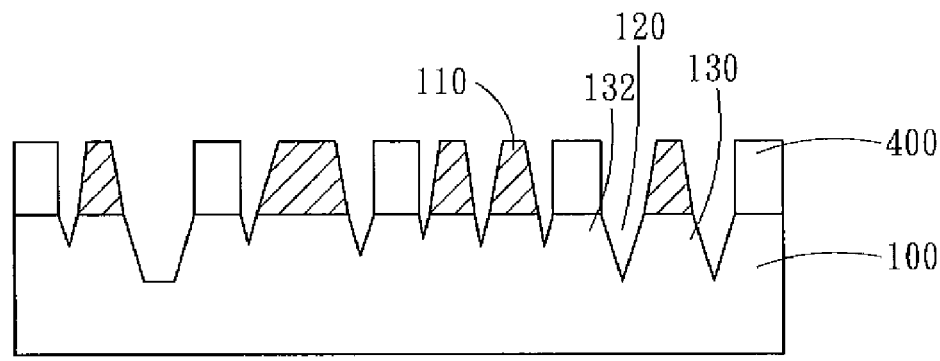
Figure 21:
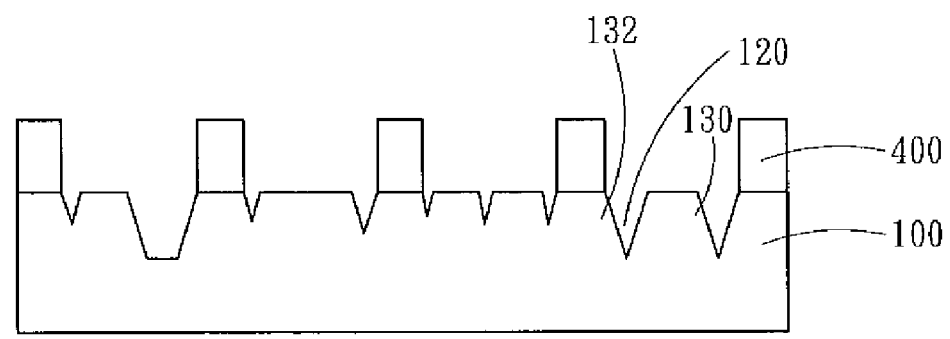

Refer to from FIG. 19 to FIG. 21 diagrams schematically showing a fifth embodiment of the present invention. The method of the fifth embodiment is based on that of the first embodiment, but a pretreatment is first performed before the substrate 100 is placed in is the first solution. The pre-treatment is to grow an epitaxial layer 400 having a thickness of between 1 Å and 10 μm on the surface of the substrate 100, as shown in FIG. 19. The epitaxial layer 400 is made of one or more materials selected from the group including: gallium nitride, indium nitride and aluminum nitride. The material of the epitaxial layer 400 is mainly determined by the n-type semiconductor layer 210, which has a greater thickness among the semiconductor light emitting structure 200 appearing in the succeeding procedures.

Next, the substrate 100 is placed in the first solution to form a high-density nanometric chemical reaction layer 110 inside the epitaxial layer 400 on the surface of the substrate 100. Next, the substrate 100 is selectively etched with the epitaxial layer 400 and the chemical reaction layer 110 being a mask to form a plurality of concave zones 120 on the substrate 100 where no epitaxial layer 400 or chemical reaction layer 110 exists and form a plurality of convex zones 130 and 132 with the chemical reaction layer 110 or the epitaxial layer 400 overhead, as shown in FIG. 20.

Next, the substrate 100 is placed in the second solution to remove the chemical reaction layer 110 and form the irregular geometry of the concave zones 120 and convex zones 130 and 132 on the substrate 100, as shown in FIG. 21. Then, similarly to the first embodiment, the layers of the semiconductor light emitting structure 200 are directly formed on the substrate 100 having the epitaxial layer 400, as shown in FIG. 4 and FIG. 5.

Embodiment VI

Figure 22:
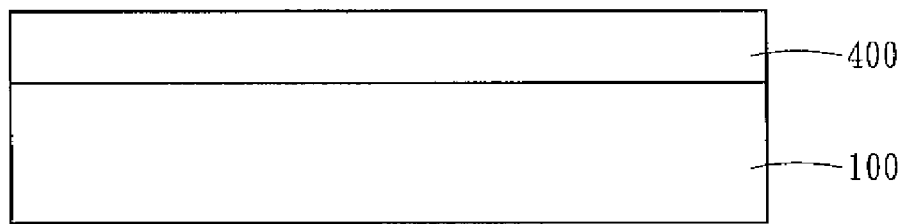
FIG. 22 to FIG. 26 are diagrams schematically showing a sixth embodiment of the present invention.
Figure 23:
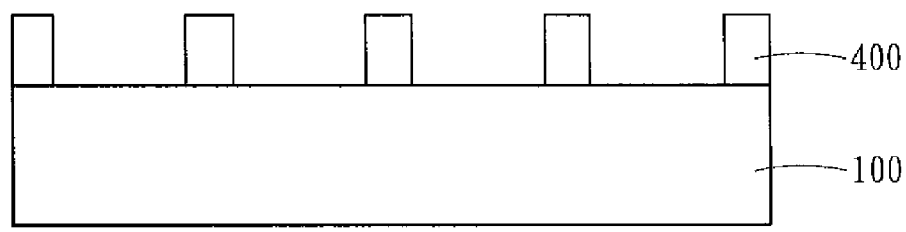

Refer to from FIG. 22 to FIG. 26 diagrams schematically showing a sixth embodiment of the present invention. The method of the sixth embodiment is based on that of the fifth embodiment, and the pre-treatment is also to grow an epitaxial layer 400 on the surface of the substrate 100, as shown in FIG. 22. Next, the epitaxial layer 400 is patterned with a photolithographic process to form periodical patterns to expose parts of the surface of the substrate 100, as shown in FIG. 23. The periodical pattern of the epitaxial layer 400 may be the periodical pattern of circles, polygons, or the combination of them. The width of the periodical pattern is within from 0.1 to 15 μm, and the spacing between the periodical patterns is also within from 0.1 to 15 μm.

Figure 24:
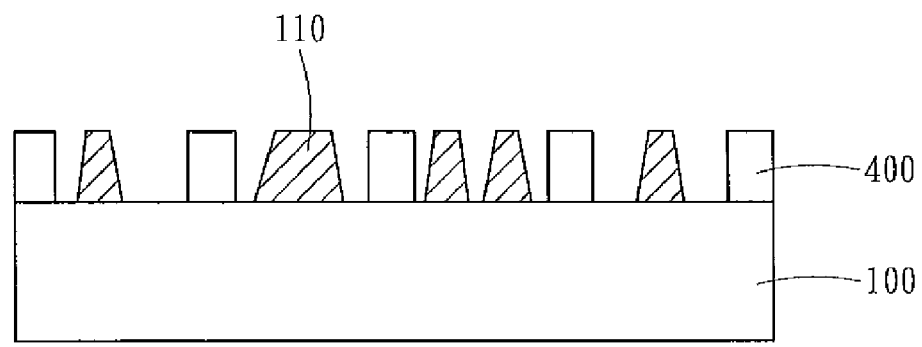
Figure 25:
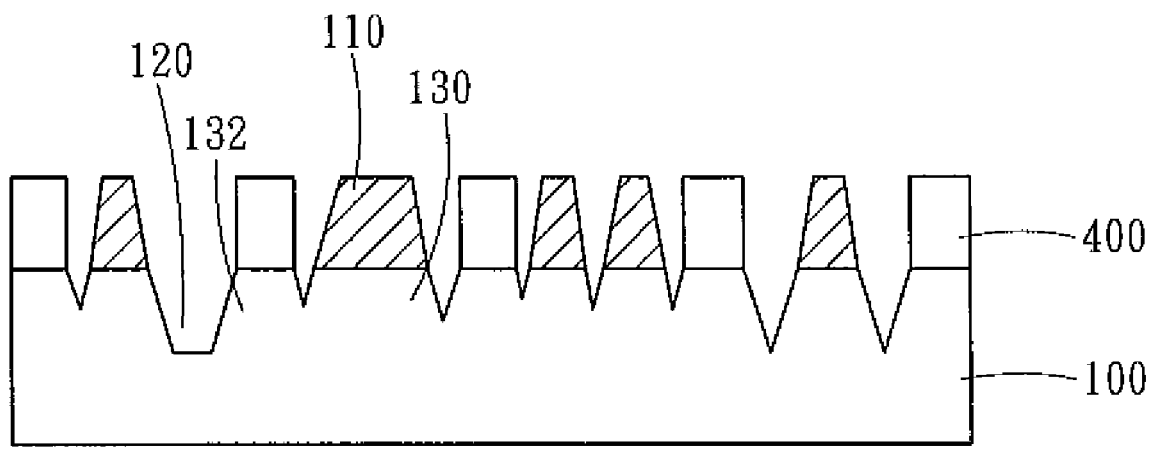

Next, the substrate 100 is placed in the first solution to form a high-density nanometric chemical reaction layer 110 on the exposed surfaces of the substrate 100, as shown in FIG. 24. Next, the substrate 100 is selectively etched with the epitaxial layer 400 and the chemical reaction layer 110 being a mask to form a plurality of concave zones 120 on the substrate 100 where no epitaxial layer 400 or chemical reaction layer 110 exists and form a plurality of convex zones 130 and 132 with the chemical reaction layer 110 or the epitaxial layer 400 overhead, as shown in FIG. 25.

Figure 26:
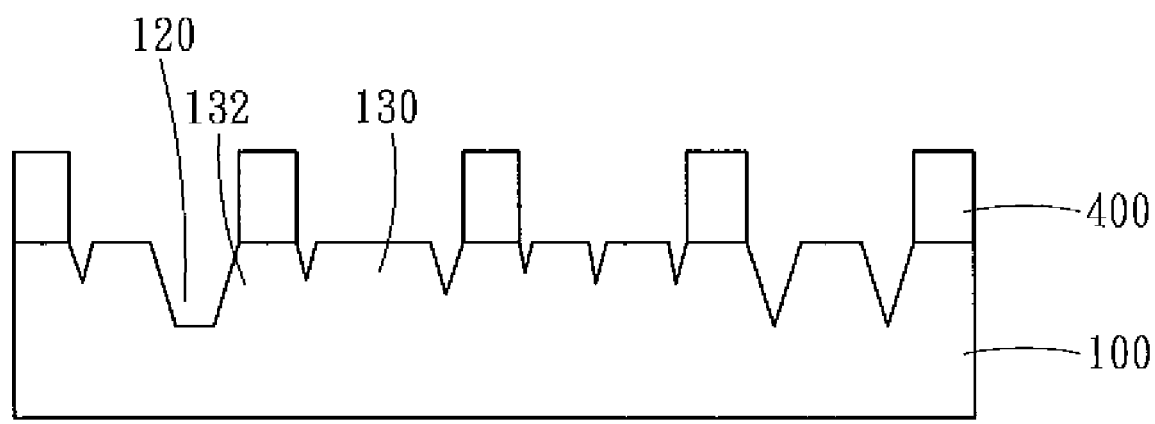

Next, the substrate 100 is placed in the second solution to remove the chemical reaction layer 110 and form an irregular geometry of the concave zones 120 and convex zones 130 and 132 on the substrate 100, as shown in FIG. 26. Then, similarly to the first embodiment, the layers of the semiconductor light emitting structure 200 are directly formed on the substrate 100 having the epitaxial layer 400, as shown in FIG. 4 and FIG. 5.

The present invention uses the chemical reaction layer 110 as a natural etching mask to form an irregular geometry of the concave zones 120 and convex zones 130 on the surface of the substrate 100 via a dry- or wet-etching method, or a combination of both etching methods. The structure of the concave zones 120 and convex zones 130 can scatter or diffract the light generated by the LED element, decrease the horizontal light propagation between the n-type semiconductor layer 210 and the substrate 100, reduce total reflection, and promote the light extraction efficiency of the LED. Further, the present invention has a simple process and thus can reduce fabrication cost and benefit mass-production.

The preferred embodiments described above are only to exemplify the present invention but not to limit the scope of the present invention. Any equivalent modification or variation according to the spirit of the present invention is to be also included within the scope of the present invention.

What is claimed is:

1. A method for fabricating a light emitting diode comprising:
   providing a substrate;
   placing said substrate in a first solution to form a high-density nanometric chemical reaction layer on the surface of said substrate;
   selectively etching said substrate with said chemical reaction layer being a mask to form a plurality of concave zones on said substrate where no said chemical reaction layer exists and form a plurality of convex zones with said chemical reaction layer overhead;
   placing said substrate in a second solution to remove said chemical reaction layer and form an irregular geometry of said concave zones and said convex zones on said substrate;
   thoroughly cleaning the surface of said substrate, forming a semiconductor light emitting structure, and using an ELOG (Epitaxial Lateral Over-Growth) technology to make said semiconductor light emitting structure fill up said concave zones with no pore formed.

2. The method for fabricating the light emitting diode according to claim 1, wherein said substrate is made of sapphire, silicon carbide, silicon, gallium arsenide, aluminum nitride, or gallium nitride.

3. The method for fabricating the light emitting diode according to claim 1, wherein said first solution or said second solution is a solution selected from a group consisting of acidic solutions, or a group consisting of basic solutions, or a mixed solution selected from said group consisting of acidic solutions or said group consisting of basic solutions.

4. The method for fabricating the light emitting diode according to claim 3, wherein said group consisting of acidic solutions includes: hydrofluoric acid (HF), sulfuric acid ($H_2SO_4$), hydrochloric acid (HCl), phosphoric acid ($H_3PO_4$), nitric acid ($HNO_3$), aqua regia, buffered oxide etch (BOE), Al Etchant, hydrogen peroxide ($H_2O_2$), formic acid (HCOOH), acetic acid ($CH_3COOH$), succinic acid ($C_4H_6O_4$), and citric acid.

5. The method for fabricating the light emitting diode according to claim 3, wherein said group consisting of basic solutions includes: solutions of potassium hydroxide (KOH), sodium hydroxide (NaOH), calcium hydroxide ($Ca(OH)_2$), ammonium hydroxide ($NH_4OH$), and tetramethylammonium hydroxide (TMAH).

6. The method for fabricating the light emitting diode according to claim 1, wherein said substrate is placed in said first solution or said second solution for from 1 second to 200 minutes.

7. The method for fabricating the light emitting diode structure according to claim 1, wherein selectively etching said substrate uses a dry-etching method, a wet etching method, or a combination of a dry-etching method and a wet-etching method.

8. The method for fabricating the light emitting diode structure according to claim 1, wherein the height difference between said concave zones and said convex zones is from 0.1 to 15 μm.

9. The method for fabricating the light emitting diode structure according to claim 1, wherein said semiconductor light emitting structure is formed via epitaxially forming at least one n-type semiconductor layer, an active layer, and at least one p-type semiconductor layer sequentially, and said active layer functions as a light emitting layer and is interposed between said n-type semiconductor layer and said p-type semiconductor layer; said p-type semiconductor layer is electrically coupled to a p-type ohmic contact electrode, and said n-type semiconductor layer is electrically coupled to an n-type ohmic contact electrode, to provide a forward bias for said semiconductor light emitting structure.

10. The method for fabricating the light emitting diode structure according to claim 1, wherein a pre-treatment is first performed before said substrate is placed in said first solution.

11. The method for fabricating the light emitting diode structure according to claim 10, wherein said pre-treatment is to grow a passivation layer on the surface of said substrate.

12. The method for fabricating the light emitting diode structure according to claim 11, wherein said passivation layer has a thickness of between 1 Å and 10 μm.

13. The method for fabricating the light emitting diode structure according to claim 11, wherein said passivation layer is a single-layer structure or a multi-layer structure, which is made of one or more materials selected from the group including: silicon, silicon nitride, silicon oxide, aluminum oxide, metal, photoresist, benzocyclobutene, and polyimide.

14. The method for fabricating the light emitting diode structure according to claim 11, wherein said passivation layer is patterned to form periodical patterns to expose parts of the surface of said substrate with a photolithographic process.

15. The method for fabricating the light emitting diode structure according to claim 14, wherein said periodical patterns of said passivation layer is periodical patterns of circles or polygons, or periodical patterns of circles and polygons.

16. The method for fabricating the light emitting diode structure according to claim 14, wherein the width of said periodical pattern is within from 0.1 to 15 μm, and the spacing between said periodical patterns is also within from 0.1 to 15 μm.

17. The method for fabricating the light emitting diode structure according to claim 14, wherein the exposed surfaces of said substrate are etched to form a plurality of recesses, and said passivation layer is removed.

18. The method for fabricating the light emitting diode structure according to claim 10, wherein said pre-treatment is to grow an epitaxial layer on the surface of said substrate.

19. The method for fabricating the light emitting diode structure according to claim 18, wherein said epitaxial layer has a thickness of between 1 Å and 10 μm.

20. The method for fabricating the light emitting diode structure according to claim 18, wherein said epitaxial layer is made of one or more materials selected from a group including: gallium nitride, indium nitride and aluminum nitride.

21. The method for fabricating the light emitting diode structure according to claim 18, wherein said epitaxial layer is patterned to form periodical patterns to expose parts of the surface of said substrate with a photolithographic process.

22. The method for fabricating the light emitting diode structure according to claim 21, wherein said periodical patterns of said epitaxial layer is periodical patterns of circles or polygons, or periodical patterns of circles and polygons.

23. The method for fabricating the light emitting diode structure according to claim 21, wherein the width of said periodical pattern is within from 0.1 to 15 μm, and the spacing between said periodical patterns is also within from 0.1 to 15 μm.

\* \* \* \* \*